United States Patent [19]

Brown

[11] Patent Number: 4,995,038
[45] Date of Patent: Feb. 19, 1991

[54] FINDING FAULTS IN CIRCUIT BOARDS

[75] Inventor: David C. Brown, Templeton, Mass.

[73] Assignee: Digital Equipment Corporation, Maynard, Mass.

[21] Appl. No.: 522,479

[22] Filed: May 11, 1990

Related U.S. Application Data

[63] Continuation of Ser. No. 225,504, Jul. 28, 1988, abandoned.

[51] Int. Cl.⁵ ............................................. G06F 11/00
[52] U.S. Cl. .................................. 371/16.1; 371/16.3; 371/66; 371/18
[58] Field of Search ...................... 321/15.1, 16.1, 16.3, 321/16.4, 16.5, 18, 19, 66

[56] References Cited

U.S. PATENT DOCUMENTS

| | | | |
|---|---|---|---|
| 3,749,897 | 7/1973 | Hirvela | 371/16.3 |
| 4,586,179 | 4/1986 | Sirazi | 371/16.3 |
| 4,729,124 | 3/1988 | Hansel | 371/18 |
| 4,782,468 | 11/1988 | Jones | 371/66 |
| 4,812,677 | 3/1989 | Perry | 371/66 |
| 4,819,237 | 4/1989 | Hamilton | 371/66 |
| 4,837,764 | 6/1989 | Russel | 371/15.1 |

OTHER PUBLICATIONS

User's Manual of HMCS 400 Series produced by Hitachi Co., p. 4.

Primary Examiner—Michael R. Fleming
Assistant Examiner—Debra A. Chun
Attorney, Agent, or Firm—Nutter, McClennen & Fish

[57] ABSTRACT

The subject invention features diagnostic circuitry installed on one or more chips of a board. This diagnostic circuitry is constructed so that during a diagnostic interval it generates a diagnostic output signal if and only if it is supplied with normal voltages on service supply structures (such as ground, B+ supply, clock) distributing service voltages to devices on the board. The diagnostic output is connected to a diagnostic output pin of the chip which may also serve as one of the operating pins of the chip (such as a signal input pin). The receptacle for the diagnostic pin is connected on the board to a diagnostic interface at the periphery of the board.

14 Claims, 2 Drawing Sheets

FINDING FAULTS IN CIRCUIT BOARDS

BACKGROUND OF THE INVENTION

This invention is a continuation of application Ser. No. 07/255,504 now abandoned which relates to finding faults in circuit boards of computer equipment, and particularly to identifying particular elements within a board that are defective.

Testing for faults in computer equipment has employed software controlled techniques to identify faulty circuit boards or modules. The identification of faulty components or other elements within a board has been done with the aid of physical probes to connect test equipment to test points on the board, either by serial probing by a technician or using automated test equipment. Probing by a technician is slow and subject to a high error rate; automatic probing is very cumbersome during development of a board design since testing must await the fabrication of a probe as well as a board, and every change in the board necessitates a redesign of the automatic probe. Furthermore, probing itself tends to produce board degradation, and all the problems of probing are exacerbated with the continual reducting of size and increased packing density of board elements. As will be described herein, an advantage of the subject invention involves an increase in the speed of identification of faulty components within a board, thereby improving upon the slow and cumbersome prior techniques.

SUMMARY OF THE INVENTION

The subject invention features diagnostic circuitry installed on one or more chips of a board. This diagnostic circuitry is constructed so that during a diagnostic interval it generates a diagnostic output signal if and only if it is supplied with normal voltages on service supply structures (such as ground, B+ supply, clock) distributing service voltages to devices on the board. The diagnostic output is connected to a diagnostic output pin of the chip which may also serve as one of the operating pins of the chip (such as a signal input pin). The receptacle for the diagnostic pin is connected on the board to a diagnostic interface at the periphery of the board.

The start and termination of the diagnostic interval may be defined by control signals ordinarily made available at the chip such as the power-on transient, assertion or deassertion of the reset, or the first data processing signal after start-up.

The diagnostic signal that is presented at the diagnostic interface may be detected or analyzed either directly or by programmed test equipment. The presence of the diagnostic signal at the diagnostic interface is a positive indication that a chip has been installed in the correct orientation and of the integrity of all the connections delivering service voltages to the chip including the joint between board and pin.

The interface may consist simply of an edge connector of the board for each chip, or various multiplexing schemes may be used to reduce the number of physical connections. In particular the diagnostic circuitry of different chips may be designed to generate distinct output signals (such as oscillations of distinct frequencies), permitting them to be carried on a single conductor without confusion.

DESCRIPTION OF THE PREFERRED EMBODIMENT

Figure 1:
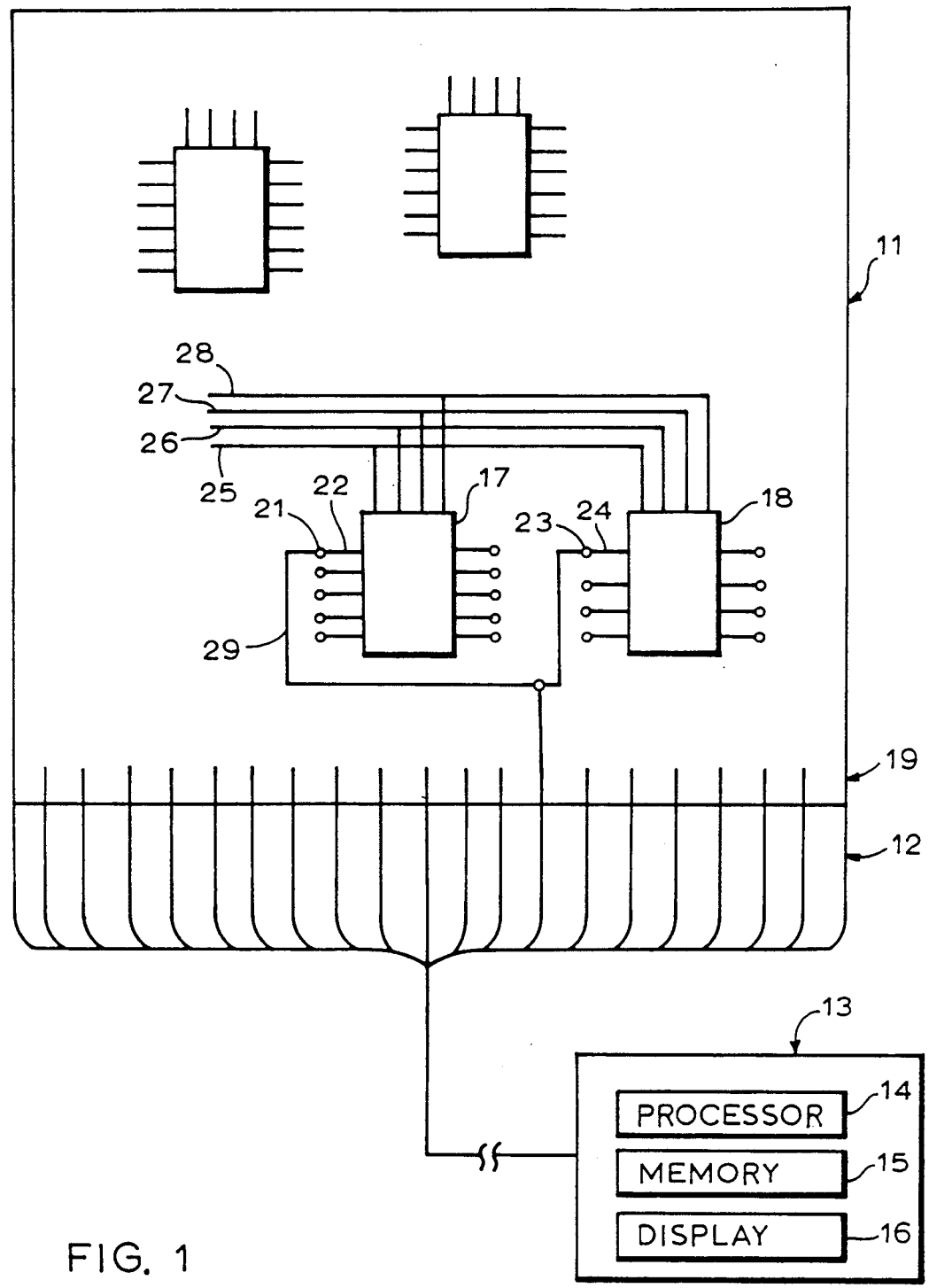
FIG. 1 shows in schematicized form a board with chips according to the invention installed thereon connected to and being tested according to the invention by a testing computer.

Referring to FIG. 1, circuit board 11, undergoing test, is shown schematically connected through connector 12 to testing computer 13, which includes a processor 14, memory 15, wherein programs are stored for controlling processor 14, and display 16.

Board 11 has installed thereon a number of integrated circuit chips of which chips 17 and 18 are representative. Receptacle 21 receives and is connected to diagnostic terminal pin 22 of chip 17, and receptacle 23 similarly receives diagnostic terminal pin 24 of chip 18. Board 11 includes an array of edge connectors 19 which function as a diagnostic interface through which diagnostic signals are presented to test computer 13. Supply lines 25, 26, 27, and 28 supply ground, power, clock, and reset services respectively to chips 17 and 18 and other chips on the board. Diagnostic connection 29 connects receptacles 21 and 23 to diagnostic interface 19.

Figure 2:
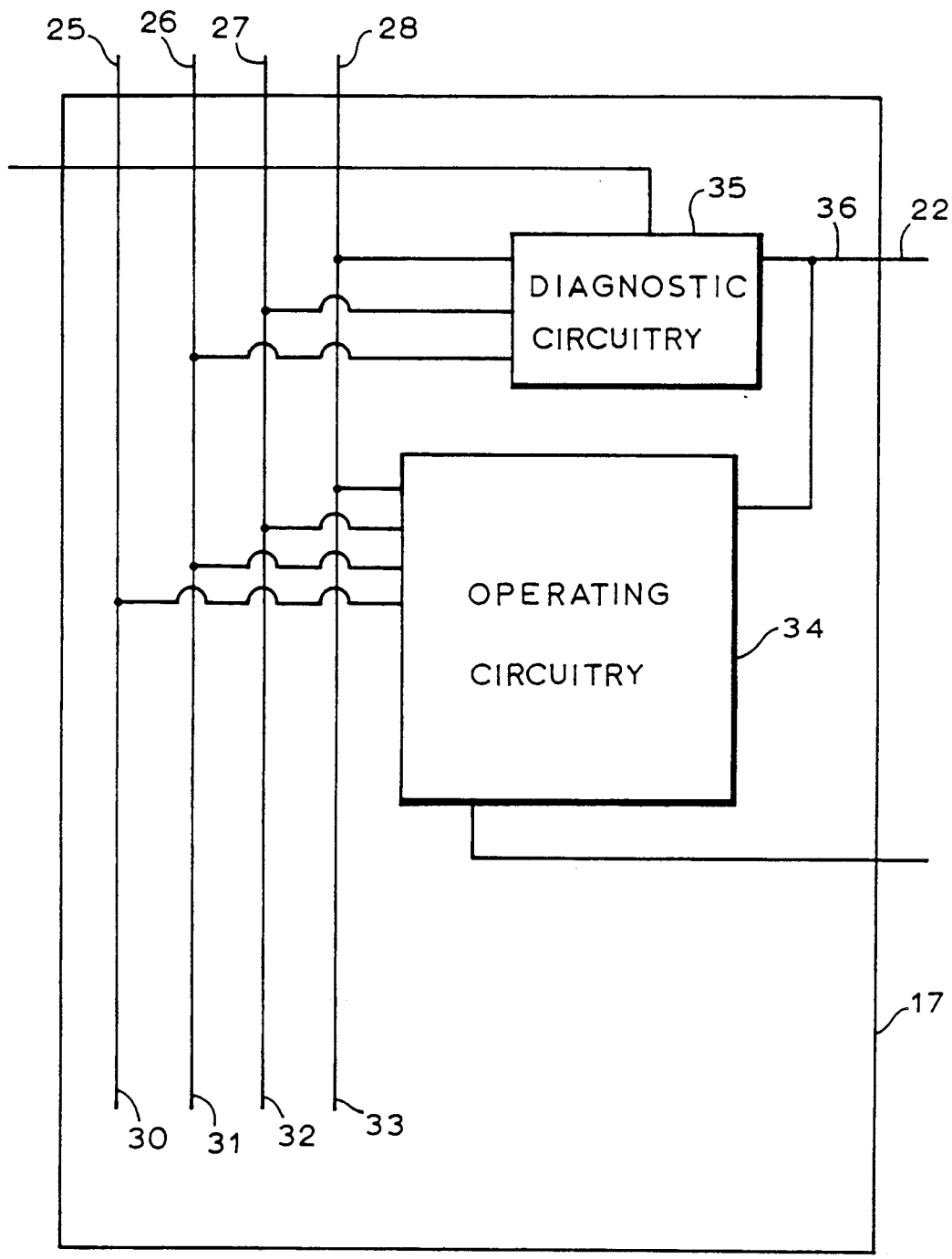
FIG. 2 shows a chip of FIG. 1 and according to the invention.

The internal structure of chip 17 (or 18), shown highly schematicized in FIG. 2, includes conventional operational circuitry 34, which effects the signal processing which the chip is designed to perform, and service supply structures 30, 31, 32, and 33 which are respectively connected to pins 25, 26, 27, and 28, and distribute ground, power, clock, and reset service voltages to appropriate points. (The service supply structures are shown symbolically as leads in FIG. 2, but in solid state chips are conductive regions snaking their way through a semiconductor wafer.)

Also included on chip 17 is diagnostic circuitry 35, which is connected to service supply structures 30, 31, 32, and 33 and to diagnostic terminal pin 22. Diagnostic circuitry 35 is constructed so that it generates a distinctive diagnostic signal when the ground, power, and clock supply structures to which it is connected present their normal operating voltages, and not otherwise. This diagnostic signal is delivered to diagnostic terminal pin 22 by conductive structure 36. The outputting of the diagnostic signal on structure 36 is further controlled to be effective only during a diagnostic interval. The beginning of the diagnostic interval may be signaled by the assertion of the reset control and terminated by the deassertion of the reset. Alternatively it may be initiated by the rising voltage of the power-up and ended by the first data processing signal thereafter, or by other control signals.

The design or construction of the diagnostic circuitry to function as described is well understood and routine for those skilled in the chip making art and need not be further discussed here.

The construction of chip 18 is generally the same as that of chip 17 (although the operating circuitry may perform a different function). The diagnostic circuitry of chip 18, however, generates a diagnostic output signal distinct from that of chip 17. The two diagnostic circuitries might for example generate periodic signals with different frequencies.

In operation, board 11 to be tested for erroneous connections is attached through connector 12 to testing computer 13. Under control of a software program in memory 15, the computer turns on the board, applies a diagnostic initiating control signal, detects and analyzes the diagnostic output signals presented through diagnostic interface 19 for dysfunctional chips and presents the results on display 16.

Alternative methods of practicing the invention will be evident to those skilled in the art including the use of various multiplexing techniques for transmitting signals from many chips across the diagnostic interface to the testing computer.

I claim:

1. An integrated circuit chip having chip operating circuitry and at least one service supply terminal for receiving at least one service voltage within a predetermined range used in the function of said chip operating circuitry, said integrated circuit chip adapted for installation on a circuit board having a diagnostic interface for connection to a test computer, said chip comprising:
   diagnostic circuitry means located within said chip for generating a diagnostic output signal during an interval between application of a diagnostic initiation signal and a diagnostic termination signal to said chip, said diagnostic output signal being generated in response to sensing at said diagnostic circuitry said at least one service voltage within said predetermined range;
   service supply structure means coupled to said at least one service supply terminal for delivering said at least one service voltage to said diagnostic circuitry means and said chip operating circuitry; and
   diagnostic output signal connection means coupled to said diagnostic circuitry means and said diagnostic interface for presenting said diagnostic output signal to said test computer.

2. The chip as claimed in claim 1, wherein said service supply structure means include a ground supply, a power supply and a clock supply.

3. The chip of claim 2 wherein said diagnostic initiation signal is a power-on transition.

4. The chip of claim 2 wherein said diagnostic initiation signal is an assertion of a reset signal.

5. The chip of claim 4 wherein said diagnostic termination signal is a deassertion of said reset signal.

6. The chip as claimed in claim 1, wherein said diagnostic initiation signal is a power-on transition.

7. The chip as claimed in claim 1, wherein said diagnostic initiation signal is an assertion of a reset signal.

8. The chip as claimed in claim 7, wherein said diagnostic termination signal is a deassertion of a reset signal.

9. The chip of claim 1 wherein said diagnostic output signal connection means includes a receptacle coupled between a diagnostic terminal pin and a diagnostic connection.

10. Apparatus for determining proper connection of an integrated circuit chip to a circuit board having at least one service supply line for delivering at least one service voltage within a predetermined range to said chip, said apparatus comprising:
    circuitry means located within said chip for generating a diagnostic output signal during an interval between application of a diagnostic initiation signal and a diagnostic termination signal to said chip, said diagnostic output signal being generated in response to sensing at said circuitry said at least one service voltage within said predetermined range;
    diagnostic output signal terminal means coupled to said circuitry means for receiving said diagnostic output signal;
    test computer means for analyzing and storing said diagnostic output signal; and
    means for connecting said diagnostic output signal terminal means to said test computer means such that said diagnostic output signal is presented to said test computer means to determine proper connection of said chip to said board.

11. The apparatus of claim 10 wherein said diagnostic initiation signal is a power-on transition.

12. The apparatus of claim 10 wherein said diagnostic initiation signal is an assertion of a reset signal.

13. An apparatus of claim 12 wherein said diagnostic termination signal is a deassertion of said reset signal.

14. A method for finding an erroneous connection of an integrated circuit chip to a circuit board having at least one service supply line for delivering at least one service voltage within a predetermined range to said chip, said method comprising:
    generating a diagnostic output signal within said chip during an interval between application of a diagnostic initiation signal and a diagnostic termination signal to said chip, said diagnostic output signal being generated in response to sensing said at least one service voltage within said predetermined range at said chip;
    transmitting said diagnostic output signal to a test computer; and
    analyzing said diagnostic output signal to determine proper connection of said chip to said board.

* * * * *